United States Patent [19]
Matsumoto

[11] Patent Number: 5,036,225
[45] Date of Patent: Jul. 30, 1991

[54] TTL-ECL LEVEL CONVERTING CIRCUIT
[75] Inventor: Kouji Matsumoto, Tokyo, Japan
[73] Assignee: NEC Corporation, Tokyo, Japan
[21] Appl. No.: 417,973
[22] Filed: Oct. 6, 1989
[30] Foreign Application Priority Data
   Oct. 6, 1988 [JP] Japan .................. 63-252682
[51] Int. Cl.$^5$ .................. H03K 19/003; H03K 17/04
[52] U.S. Cl. .................. 307/475; 307/456; 307/458
[58] Field of Search .............. 307/475, 446, 455, 456, 307/443, 362, 542, 542.1, 300, 264

[56] References Cited
U.S. PATENT DOCUMENTS

| | | | |
|---|---|---|---|
| 4,654,549 | 3/1987 | Hannington | 307/443 |
| 4,698,527 | 10/1987 | Matsumoto | 307/475 |
| 4,771,191 | 9/1988 | Estrada | 307/475 |
| 4,825,108 | 4/1989 | Burton et al. | 307/475 |
| 4,877,977 | 10/1989 | Kokado | 307/443 |

Primary Examiner—Timothy P. Callahan
Attorney, Agent, or Firm—Helfgott & Karas

[57] ABSTRACT

A TTL-ECL converting circuit comprises a Schottky barrier diode, the cathode of which is connected to an input terminal receiving a TTL signal and the anode of which is connected to a first resistor, the other end of which is connected to a high voltage supply line. The circuit further includes a first transistor having its collector connected to the high voltage supply line, a base connected to the Schottky barrier and the first resistor and an emitter connected to a level shift resistor which is also connected to a cathode of a level shift diode having its anode connected to a constant current source which has its other end connected to a low voltage supply line. A second transistor provided in the circuit has its collector connected to the Schottky barrier diode and the first resistor, a base connected to a connection between the level shift resistor and the level shift diode, and an emitter connected through a further resistor to an intermediate voltage supply line. An emitter follower is connected between the intermediate voltage supply line and the low voltage supply line. The emitter follower has in input connected to the level shift diode and an output connected to an output terminal outputting an ECL signal.

10 Claims, 4 Drawing Sheets

TTL-ECL LEVEL CONVERTING CIRCUIT

BACKGROUND OF THE INVENTION

1. Field of the Invention

The present invention relates to a TTL-ECL converting circuit, and more specifically to a TTL-ECL converting circuit which operates at a high speed and which is free from self-oscillation.

2. Description of Related Art

Recently, ECL (emitter coupled logic) circuits in the form of an integrated circuit having a high integration density have been used in various fields requiring a high speed operation, for example, so-called main frames, communication instruments, LSI testers, measuring instruments, etc. In many cases, however, the above mentioned instruments are provided, as a memory, with an inexpensive standard semiconductor memory having a TTL (transistor-transistor logic) interface. Therefore, an interface of the ECL integrated circuit having a high integration density has been provided with a TTL-ECL level converting circuit, and therefore, both an ECL interface and a TTL interface have been assembled within a single LSI chip.

However, the conventional TTL-ECL level converting circuits have been disadvantageous in that a base potential of a transistor receiving a TTL input signal is apt to cause vibration, and the vibrating voltage is propagated as noises to an ECL level output signal. The noise has the possibility of causing a next stage of ECL circuit to malfunction.

Furthermore, the conventional TTL-ECL level converting circuits have a logical amplitude of the ECL output signal much larger than the logical amplitude in ordinary ECL circuits. Therefore, the propagation delay time is inevitably large.

SUMMARY OF THE INVENTION

Accordingly, it is an object of the present invention to provide a TTL-ECL level converting circuit which has overcome the above mentioned defect of the conventional one.

Another object of the present invention is to provide a TTL-ECL level converting circuit free from a self vibration, so as to avoid possibility of causing a next stage of ECL circuit to malfunction.

A further object of the present invention is to provide a TTL-ECL level converting circuit outputting an ECL output signal having a logical amplitude comparable to the logical amplitude in ordinary ECL circuits.

The above and other objects of the present invention are achieved in accordance with the present invention by a TTL-ECL converting circuit comprising a Schottky barrier diode having a cathode connected to an input terminal for a TTL signal and an anode connected to a first connection node, a resistor having its one end connected to a high voltage supply line and its other end connected to the first connection node, a first transistor having a collector connected to the high voltage supply line, a base connected to the first connection node and an emitter connected to a second connection node, a first level shift means having its one end connected to the second connection node and its other end connected to a third connection node, a second level shift means having its one end connected to the third connection node and its other end connected to a fourth connection node, a constant current source having its end connected to the fourth connection node and its other end connected to a low voltage supply line, a second transistor having a collector connected to the first connection node, a base connected to the third connection node and an emitter connected through another resistor to an intermediate voltage supply line, and an emitter follower connected between the intermediate voltage supply line and the low voltage supply line and having an input connected to the fourth connection node and an output connected to an output terminal for an ECL signal.

The above and other objects, features and advantages of the present invention will be apparent from the following description of preferred embodiments of the invention with reference to the accompanying drawings.

DESCRIPTION OF THE PREFERRED EMBODIMENTS

Figure 1:
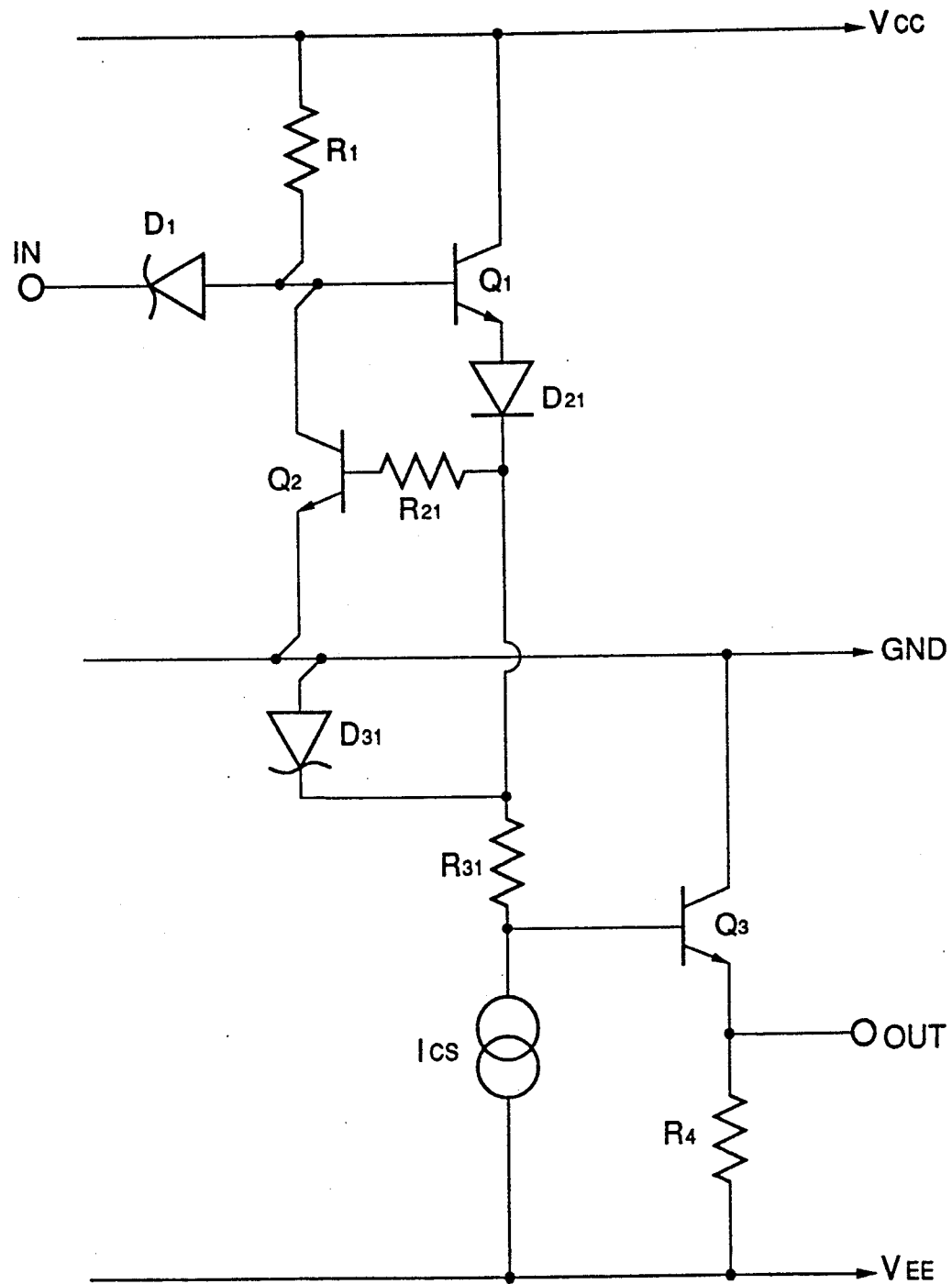
FIG. 1 is a circuit diagram of a conventional TTL-ECL level converting circuit.

Referring to FIG. 1, there is shown a circuit diagram of a conventional TTL-ECL level converting circuit. The shown circuit includes an input terminal IN for receiving a TTL level signal and an output terminal OUT for outputting an ECL level signal. The input terminal IN is connected to a cathode of a Schottky barrier diode $D_1$, whose anode is connected to one end of a resistor $R_1$, a base of a first transistor $Q_1$ and a collector of a second transistor $Q_2$, respectively. The other end of the resistor $R_1$ and a collector of the first transistor $Q_1$ are connected to a high voltage supply line $V_{CC}$. An emitter of the first transistor $Q_1$ is connected to a low voltage supply line $V_{EE}$ through a diode $D_{21}$, a resistor $R_{31}$ and a constant current source Ics. In addition, an emitter of the second transistor $Q_2$ is connected to a ground line GND, and a base of the second transistor $Q_2$ is connected through a resistor $R_{21}$ to a connection node between the diode $D_{21}$ and the resistor $R_{31}$. Another Schottky barrier diode $D_{31}$ is connected between the ground line GND and the connection node between the diode $D_{21}$ and the resistor $R_{31}$. Furthermore, there is provided a third transistor $Q_3$ having a collector connected to the ground line GND, and a base connected to a connection node between the resistor $R_{31}$ and the constant current source Ics. An emitter of the third transistor $Q_3$ is connected through a resistor $R_4$ to the low voltage supply line $V_{EE}$ and is also connected to the output terminal OUT.

Now, an operation of the above mentioned TTL-ECL level converting circuit will be explained. A TTL level signal applied to the input terminal IN is level-shifted by the diode $D_1$, the transistor $Q_1$, the diode $D_{21}$ and the resistor $R_{31}$, and outputted as an ECL level signal from the output terminal OUT through an emitter follower formed of the transistor $Q_3$ and the resistor $R_4$.

The ECL level signal is set as follows: When the TTL level signal of a high level $V_{IH}$ is inputted, the transistor $Q_1$, the diode $D_{21}$ and the transistor $Q_2$ are brought into an on condition, and on the other hand, the diode $D_1$ is brought into an off condition. If a forward direction voltage of diodes and transistors is expressed by $V_F$, this input voltage $V_{IH}$ must fulfil the following condition (1) in order to render the diode $D_1$ off:

$$V_{IH} \geq V_F(Q_2) + V_F(D_{21}) + V_F(Q_1) - V_F(D_1) \qquad (1)$$

In general, the forward direction operating voltage $V_F$ is 0.8 V in diodes and transistors and 0.4 V in Schottky barrier diodes, and therefore, the high level condition becomes stable if $V_{IH} \geq 2.0$ V. In this condition, the high level output $V_{OH}$ of the ECL level signal is expressed by the following equation (2):

$$V_{OH} = V_F(Q_2) - R_{31} \cdot I_{cs} - V_F(Q_3)$$
$$\cdot I_{cs} - V_F(Q_3) \approx -R_{31} \cdot I_{cs} \qquad (2)$$

where Ics is a current value of the constant current source Ics)

On the other hand, when the TTL level signal of a low level $V_{IL}$ is inputted, the diodes $D_1$ and $D_{31}$ are brought into an on condition, and the transistor $Q_2$ is brought into an off condition. In this condition, in order to ensure the on condition of the diode $D_1$, the input voltage $V_{IL}$ must fulfil the following condition (3):

$$V_{IL} \leq -V_F(D_{31}) + V_F(D_{21}) + V_F(Q_1) - V_F(D_1) \qquad (3)$$

Therefore, the low level condition becomes stable under the condition of of $V_{IL} \leq 0.8$ V.

In this condition, a low level output $V_{OL}$ of the ECL level signal is expressed by the following equation (4):

$$V_{OL} = -V_F(D_{31}) - R_{31} \cdot I_{cs} - V_F(Q_3) \qquad (4)$$

As seen from the equations (2) and (4), the ECL level output of the circuit shown in FIG. 1 has a logical amplitude (a difference between $V_{OH}$ and $V_{OL}$) corresponding to the sum of the forward direction operating voltage of one transistor and the forward direction operating voltage of one Schottky barrier diode (about 1.2 V).

In the circuit shown in FIG. 1, when the input TTL level signal is brought from the low level to the high level, a base potential of the transistor $Q_1$ is elevated to follow the input TTL level signal, and the elevating potential is level-shifted by the transistor $Q_1$, the diode $D_{21}$ and the resistor $R_{21}$ and applied to the base of the transistor $Q_2$ so as to cause to turn on the transistor $Q_2$. Namely, an current flows through the resistor $R_1$ with the result that a balanced and stable condition is established. In the above mentioned process, a propagation delay will occur in the course of the level shifting, and therefore, the base potential of the transistor $Q_1$ is apt to cause vibration due to a delay of the turning-on of the transistor $Q_2$ and a voltage drop caused across the resistor $R_1$ by an abruptly increasing operation current.

Specifically, when the input signal on the input terminal IN changes from the low level to the high level, the base potential of the transistor $Q_1$ elevates towards a potential of the high voltage supply $V_{CC}$ through the resistor $R_1$. This elevated voltage is propagated to the base of the transistor $Q_2$ through the transistor $Q_1$, the diode $D_{21}$ and the resistor $R_{21}$ with a delay corresponding to a propagation delay time of these elements. As a result, the current of the transistor $Q_2$ is increased, and a collector potential of the transistor $Q_2$ is correspondingly decreased due to a voltage drop across the resistor $R_1$. The drop of the collector potential of the transistor $Q_2$ is propagated to the base of the transistor $Q_2$ after a constant delay time, so that the base potential of the transistor $Q_2$ is decreased, and therefore, the collector current of the transistor $Q_2$ is correspondingly decreased. As result, the collector potential of the transistor $Q_2$ is elevated at this time.

The above mentioned operation is repeated and therefore the base potential of the transistor $Q_1$ fluctuates or vibrates. This vibration waveform is level-shifted, and thereafter, is propagated as noises to the high level of the ECL level output signal. The noise has the possibility of cause a next stage of ECL circuit to malfunction.

Furthermore, the circuit shown in FIG. 1 has the logical amplitude of the ECL output signal corresponding to the sum of the forward direction operating voltage of one transistor $Q_2$ and the forward direction operating voltage of one Schottky barrier diode $D_{31}$. This logical amplitude of the ECL output signal is much larger than a logical amplitude of 0.6 V in ordinary ECL circuits. Therefore, the propagation delay time inevitably becomes large.

Figure 2:
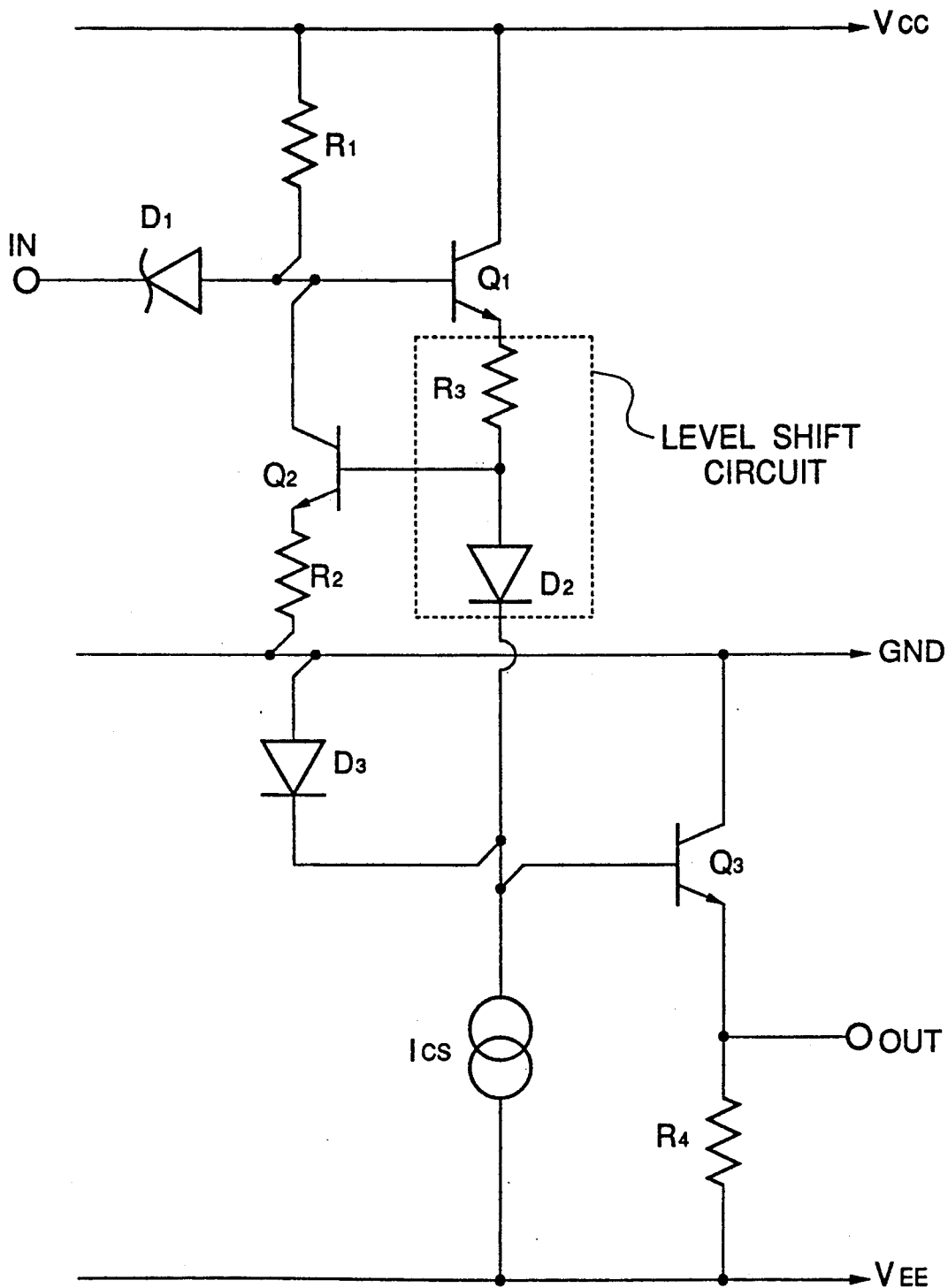
FIG. 2 is a circuit diagram of one embodiment of the TTL-ECL level converting circuit in accordance with the present invention.

Referring to FIG. 2, there is shown a circuit diagram of one embodiment of the TTL-ECL level converting circuit in accordance with the present invention. In FIG. 2, elements similar or corresponding to those shown in FIG. 1 are given the same Reference Characters, and explanation thereof will be omitted for simplification of description.

As seen from FIG. 2, a level shift circuit in the conversion circuit shown FIG. 2 connected to the emitter of the transistor $Q_1$ is composed of a series circuit consisting of a resistor $R_3$ and a diode $D_2$ in such a manner that the resistor $R_3$ is connected at its one end to the emitter of the transistor $Q_1$ and at its other end to an anode of the diode $D_2$, and a cathode of the diode $D_2$ is connected to the current source Ics. A connection node between the resistor $R_3$ and the diode $D_2$ is connected directly to the base of the transistor $Q_2$. In addition, a resistor $R_2$ is connected between the emitter of the transistor $Q_2$ and the ground line GND. A cathode of an anode-grounded diode $D_3$ for low level clamping is connected to the cathode of the diode $D_2$ which forms an output end of the level shift circuit.

Now, an operation of the TTL-ECL level converting circuit shown in FIG. 2 will be explained. When the TTL level input signal is at a high level $V_{IH}$, the transistors $Q_1$ and $Q_2$ and the diode $D_2$ are brought into an on condition, and on the other hand, the diodes $D_1$ and $D_3$ are brought into an off condition. In other words, an operation current of the transistor $Q_2$ flows through the resistor $R_1$ so that an anode potential of the diode $D_1$ is maintained at a constant level. Therefore, a voltage difference $V(D_1)$ between the anode potential of the diode $D_1$ and the high level of TTL level signal applied at the cathode of the diode $D_1$ becomes smaller than the forward direction operation voltage $V_F(D_1)$ of the diode $D_1$, and therefore, the diode $D_1$ is turned off. With this, the status is balanced. In this condition, the operating current $I_F(Q_2)$ of the transistor $Q_2$ is expressed by the following equation (5):

$$I_F(Q_2) = \{V_{CC} - V_F(Q_1) - R_3 \cdot I_{cs} - V_F(Q_2)\}/(R_1 + R_2) \qquad (5)$$

In addition, the voltage difference $V(D_1)$ applied across the Schottky barrier diode $D_1$ is expressed by the following equation (6):

$$V(D_1) = V_F(Q_1) + R_3 \cdot I_{CS} + V_F(Q_2) + R_2 \cdot I_F(Q_2) - V_{IH} \quad (6)$$

A condition for maintaining the Schottky diode $D_1$ in an off condition can be expressed by the following equation (6a):

$$V(D_1) < V_F(D_1) \quad (6a)$$

Here, assuming $V_F(Q_1) = V_F(Q_2) = 0.8V$, $R_3 = 2K\Omega$, $I_{CS} = 0.3mA$, $R_2 = 1K\Omega$, $V_{CC} = 5V$, $R_1 = 20K\Omega$, $V_{IH} \geq 2.0V$, and $V_F(D_1) = 0.4V$, the above mentioned condition is fulfilled.

In this case, the high level $V_{OH}$ of the ECL level output is expressed by the following equation (7):

$$V_{OH} = R_2 \cdot I_F(Q_2) + V_F(Q_2) - V_F(D_2) - V_F(Q_3)$$
$$\approx R_2 \cdot I_F(Q_2) - V_F(Q_3) \quad (7)$$

On the other hand, when the TTL level signal of a low level $V_{IL}$ is inputted, the diodes $D_1$ and $D_3$ are brought into an on condition, and the transistor $Q_2$ is brought into an off condition. In this condition, the cathode potential of the diode $D_2$ becomes a low voltage sufficient to turn on the diode $D_3$. The condition for this is expressed by the following equation (8):

$$|V_{IL} + V_F(D_1) - V_F(Q_1) - R_3 \cdot I_{CS} - V_F(D_2)| \geq V_F(D_3) \quad (8)$$

Here, assuming $V_{IL} \leq 0.8V$, $V_F(D_1) = 0.4V$, $V_F(Q_1) = V_F(D_2) = V_F(Q_3) = 0.8V$, $R_3 = 2K\Omega$, and $I_{CS} = 0.3mA$, the above mentioned condition (8) is fulfilled.

In this condition, a low level output $V_{OL}$ of the ECL level signal is expressed by the following equation (9):

$$V_{OL} = -V_F(D_3) - V_F(Q_3) \quad (9)$$

As seen from the above equations (7) and (9), the logical amplitude of the ECL output signal of the converting circuit shown in FIG. 2 is expressed by the following equation (10):

$$V_{OH} - V_{OL} = R_2 \cdot I_F(Q_2) + V_F(D_3) \quad (10)$$

Here, if $I_F(Q_2)$ is calculated in accordance with the equation (5) in the example in which the respective elements have the above mentioned values, respectively, the logical amplitude of the ECL level output signal of the converting circuit shown in FIG. 2 have about 0.93 V, which is apparently smaller than that of the circuit shown in FIG. 1. In addition, if a Schottky barrier diode is used as the diode $D_3$ and the value of the resistor $R_2$ is 1.5K$\Omega$, the logical amplitude of the ECL level output signal can be reduced to 0.6 V under the condition that the equations (6a) and (8) are fulfilled.

Figure 4A:
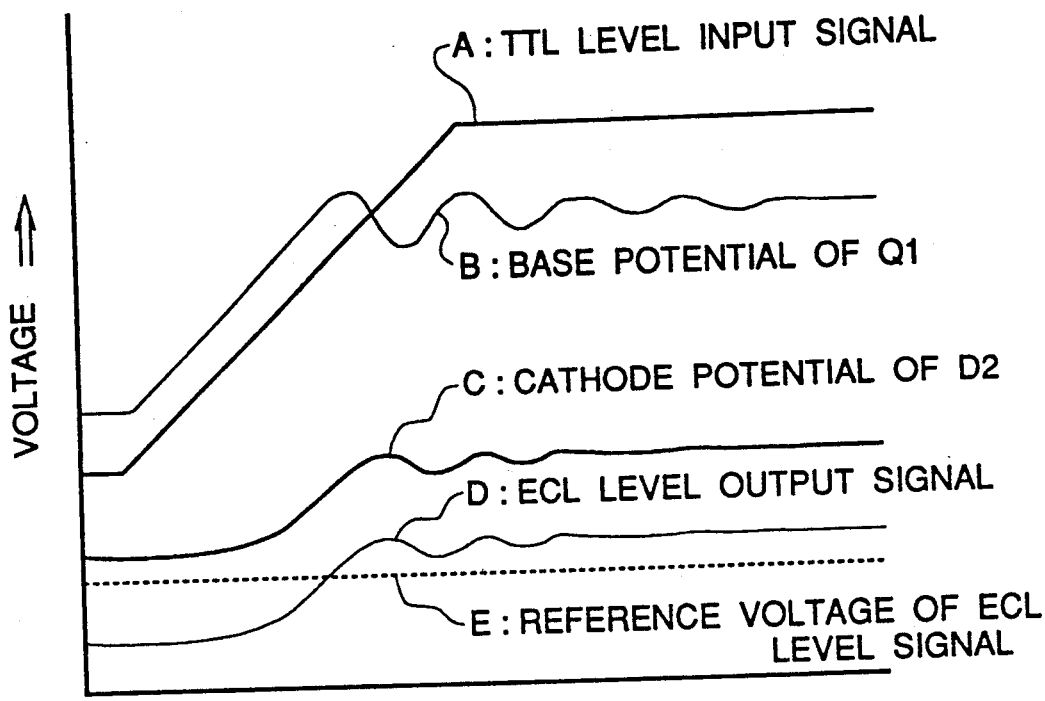
FIGS. 4A and 4B are voltage waveform diagrams illustrating the operation of the circuit shown in FIG. 2 and a comparative circuit.
Figure 4B:
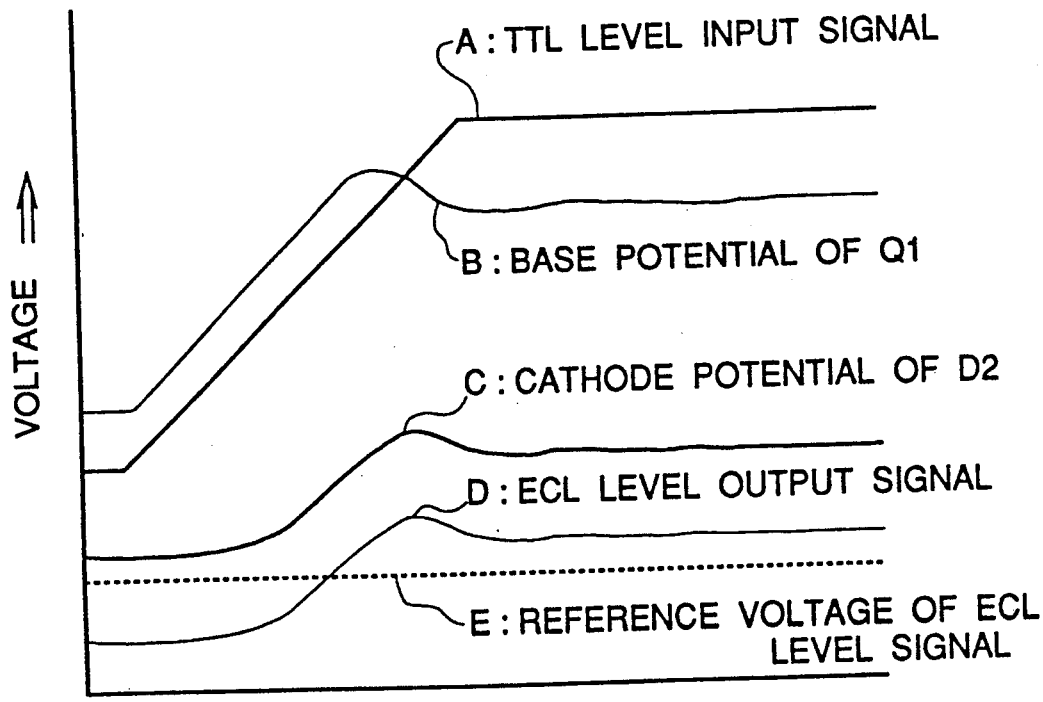

Next, a vibration restraining effect obtained by inserting the resistor $R_2$ between the emitter of the transistor $Q_2$ and the ground line GND will be explained on the basis of a result of simulation. FIG. 4A shows a graph illustrating voltage variations on various points in the converting circuit shown in FIG. 2 in which the resistor $R_2$ is removed and the emitter of the transistor $Q_2$ is directly connected to the ground line GND. FIG. 4B is a graph illustrating voltage variations on various points in the converting circuit shown in FIG. 2. These figures show transitions when the TTL input signal is brought from the low level to the high level. In each of these figures, the line A shows the TTL level input signal, and the line B shows the base potential of the transistor $Q_1$. The lines C, D and E indicate the cathode potential of the diode $D_2$, the ECL level output signal, and a reference voltage for the ECL level signal, respectively. In addition, the values of the respective elements used in the circuit for the simulation are in accordance with the values as mentioned hereinbefore.

As shown in FIG. 4A, in the case of no resistor $R_2$, the base potential of the transistor $Q_2$ greatly vibrates, and therefore, the ECL level output signal correspondingly vibrates. If this vibration exceeds the reference voltage for the ECL level signal indicated by the line E, a malfunction will occur. On the other hand, in the circuit shown in FIG. 2, the vibration of the base potential of the transistor $Q_1$ is almost perfectly restrained, and therefore, there is little possibility of malfunction.

Figure 3A:
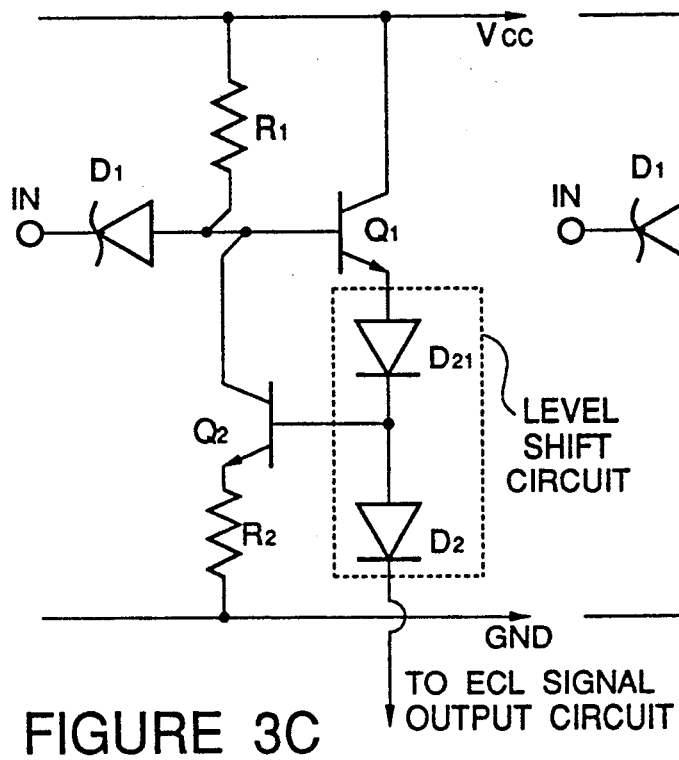
FIGS. 3A, 3B and 3C are circuit diagrams illustrating various modifications of the TTL-ECL level converting circuit shown in FIG. 2.
Figure 3B:
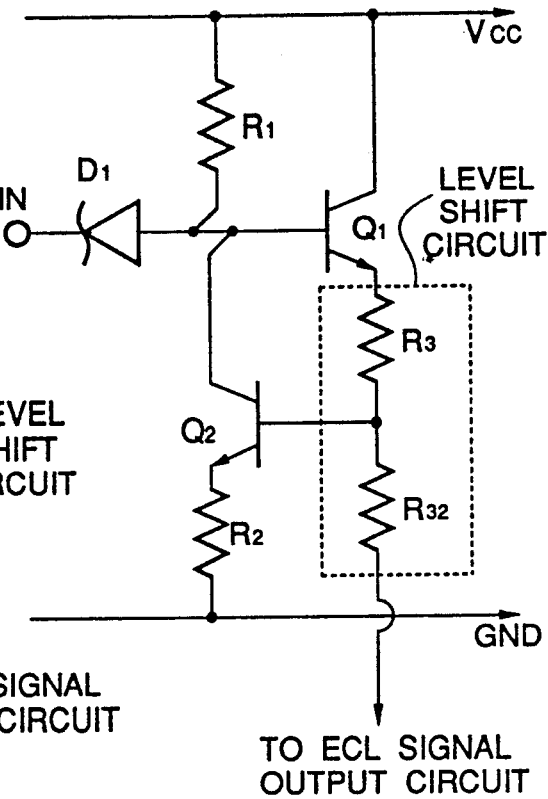
Figure 3C:
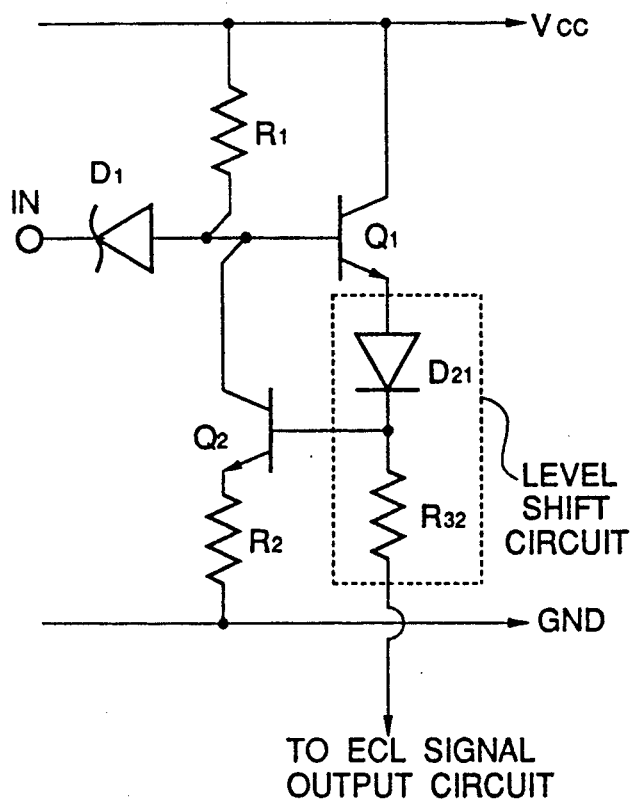

Turning to FIGS. 3A, 3B and 3C, there are shown some modifications of the level shift circuit portion of the converting circuit shown in FIG. 2.

In the modification shown in FIG. 3A, the level shift circuit is composed of a series circuit consisting of two diodes $D_{21}$ and $D_2$. In this modified converting circuit, since the level shift circuit is composed of a low impedance circuit formed of only the diodes, the propagation delay can be shortened to a minimum extent.

In the modification shown in FIG. 3B, the level shift circuit is composed of a series circuit consisting of two resistors $R_3$ and $R_{32}$. In this modified converting circuit, since the constant current flows through the resistors of the level shift circuit, a temperature dependency of the threshold of the converting circuit is eliminated. Ordinarily, the forward direction operating voltage of diodes and transistors has the temperature dependency of about 2 mV/°C. In the circuit shown in FIG. 2, the temperature dependencies of the Schottky barrier diode $D_1$ and the transistors $Q_1$ are countervailed or compensated to each other. In the modification shown in FIG. 3B, on the other hand, the level shift circuit does not have a temperature dependency. As a result, the converting circuit modified in accordance with the modification shown in FIG. 3B has the threshold with no temperature dependency. This is very advantageous in that even if the converting circuit and an ECL circuit which generates a large amount of heat due to power consumption are integrated in the same chip, the converting circuit maintains its threshold at a constant level regardless of temperature change.

In the modification shown in FIG. 3C, the level shift circuit is composed of a series circuit consisting of a diode $D_{21}$ and a resistor $R_{32}$ in such a manner that the diode $D_{21}$ is connected at its anode to the emitter of the transistor $D_{21}$ and at its cathode to one end of the resistor $R_{32}$ and the base of the transistor $Q_2$. This modified converting circuit has an excellent balance concerning both of the delay time and the threshold temperature dependency.

The invention has thus been shown and described with reference to the specific embodiments. However, it should be noted that the present invention is in no way limited to the details of the illustrated structures but changes and modifications may be made within the scope of the appended claims.

I claim:

1. TTL-ECL converting circuit comprising a Schottky barrier diode having a cathode connected to an input terminal for a TTL signal and an anode connected to a first connection node; a resistor having one end connected to a high voltage supply line and another end connected to said first connection node; a first transistor having a collector connected to said high voltage supply line, a base connected to said first connection node and an emitter connected to a second connection node; a first level shift means having one end connected to said second connection node and another end connected to a third connection node; a second level shift means having one end connected to said third connection node and another end connected to a fourth connection node; a constant current source having one end connected to said fourth connection node and, another end connected to a low voltage supply line; a second transistor having a collector connected to said first connection node, a base connected to said third connection node and an emitter connected through another resistor to an intermediate voltage supply line which has a potential independent of that of said fourth connection node; a diode having an anode connected to said intermediate voltage supply line and a cathode connected to said fourth connection node; and an emitter follower connected between said intermediate voltage supply line and said low voltage supply line and having an input connected to said fourth connection node and an output connected to an output terminal for an ECL signal.

2. A circuit claimed in claim 1 wherein said first level shift means is composed of a resistor having one end connected to said second connection node and another end connected to said third connection node, and said second level shift means is composed of a diode having an anode connected to said third connection node and a cathode connected to said fourth connection node.

3. A circuit as claimed in claim 1 wherein said first level shift means is composed of a diode having an anode connected to said second connection node and a cathode connected to said third connection node, and said second level shift means is composed of another diode having an anode connected to said third connection node and a cathode connected to said fourth connection node.

4. A circuit claimed in claim 1 wherein said first level shift means is composed of a resistor having one end connected to said second connection node and another end connected to said third connection node, and said second level shift means is composed of another resistor having one end connected to said third connection node and another end connected to said fourth connection node.

5. A circuit claimed in claim 1 wherein said first level shift means is composed of a diode having an anode connected to said second connection node and a cathode connected to said third connection node, and said second level shift means is composed of a resistor having one end connected to said third connection node and another end connected to said fourth connection node.

6. A TTL-ECL converting circuit comprising a Schottky barrier diode having a cathode connected to an input terminal for a TTL signal and an anode connected to a first connection node; a resistor having one end connected to a high voltage supply line and another end connected to said first connection node; a first transistor having a collector connected to said high voltage supply line, a base connected to said first connection node and an emitter connected to a second connection node; a level shift means having one end connected to said second connection node, an intermediate node forming a third connection node, and another end connected to a fourth connection node; a constant current source having one end connected to said fourth connection node and another end connected to a low voltage supply line; a second transistor having a collector connected to said first connection node, a base connected to said third connection node and an emitter connected through a second resistor to an intermediate voltage supply line which has a potential independent of that of said fourth connection node; a diode having an anode connected to said intermediate voltage supply line and a cathode connected to said fourth connection node; and an emitter follower connected between said an intermediate voltage supply line and said low voltage supply line and having an input connected to said fourth connection node and an output connected to an output terminal for an ECL signal.

7. A circuit claimed in claim 6 wherein said level shift means includes a resistor having one end connected to said second connection node and another end connected to said third connection node, and a diode having an anode connected to said third connection node and a cathode connected to said fourth connection node.

8. A circuit claimed in claim 6 wherein said level shift means includes a diode having an anode connected to said second connection node and a cathode connected to said third connection node, and another diode having an anode connected to said third connection node and a cathode connected to said fourth connection node.

9. A circuit claimed in claim 6 wherein said level shift means includes a resistor having one end connected to said second connection node and another end connected to said third connection node, and another resistor having one end connected to said third connection node and another end connected to said fourth connection node.

10. A circuit claimed in claim 6 wherein said level shift means includes a diode having an anode connected to said second connection node and a cathode connected to said third connection node, and a resistor having one end connected to said third connection node and another end connected to said fourth connection node.

* * * * *